(12) United States Patent
Schulze et al.

(10) Patent No.: US 7,612,344 B1
(45) Date of Patent: Nov. 3, 2009

(54) RADIATION DETECTOR AND METHOD

(75) Inventors: Hans-Joachim Schulze, Taufkirchen (DE); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/143,458

(22) Filed: Jun. 20, 2008

(51) Int. Cl.
*G01T 1/24* (2006.01)

(52) U.S. Cl. .................................. 250/370.01

(58) Field of Classification Search .............. 250/370.01–370.15; 378/98.8
See application file for complete search history.

(56) References Cited

U.S. PATENT DOCUMENTS

| | | | | |
|---|---|---|---|---|
| 5,633,180 | A | * | 5/1997 | Bajor ..................... 438/358 |
| 5,797,998 | A | * | 8/1998 | Wenham et al. ........ 136/255 |
| 6,489,190 | B2 | * | 12/2002 | Disney ................... 438/188 |
| 2007/0093019 | A1 | * | 4/2007 | Rieger et al. ........... 438/243 |

OTHER PUBLICATIONS

Eranen et al., "Silicon semi 3D radiation detector,", 2004, IEEE Nuclear Science Symposium Conference Record, vol. 2, pp. 1231-1235.*
Candelori, "Semiconductor materials and detectors for future very high luminosity colliders,", 2005, IEEE Transactions on Nuclear Science, vol. 52, No. 6, pp. 2554-2561.*
Kenney et al., Silicon Detectors with 3-D Electrode Arrays: Fabrication and Initial Test Results, IEEE, 1999, pp. 1224-1236.
Kenney et al., Observation of Beta and X Rays with 3-D-Architecture Silicon Microstrip Sensors, IEEE, 2001, pp. 189-193.

* cited by examiner

*Primary Examiner*—David P Porta
*Assistant Examiner*—Kiho Kim
(74) *Attorney, Agent, or Firm*—Dicke, Billig & Czaja, PLLC

(57) ABSTRACT

A radiation detector and method. One embodiment provides a radiation detector including a semiconductor body with a first base zone of a first conduction type and with at least one second base zone arranged at least partly in the first base zone, extending in a vertical direction of the semiconductor body and doped complementarily to the first base zone. The method provides a semiconductor substrate. Several epitaxial layers are produced arranged one above another on the semiconductor substrate. The layers in each case include a basic doping of the first conduction type and together with the semiconductor substrate form the semiconductor body. Semiconductor zones of a second conduction type are produced.

25 Claims, 7 Drawing Sheets

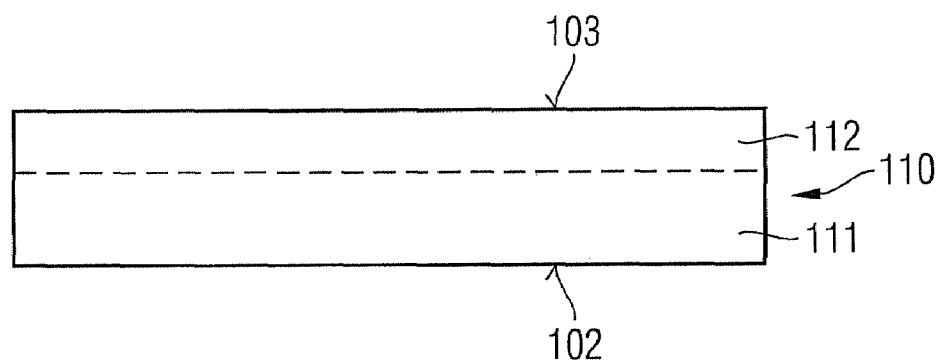
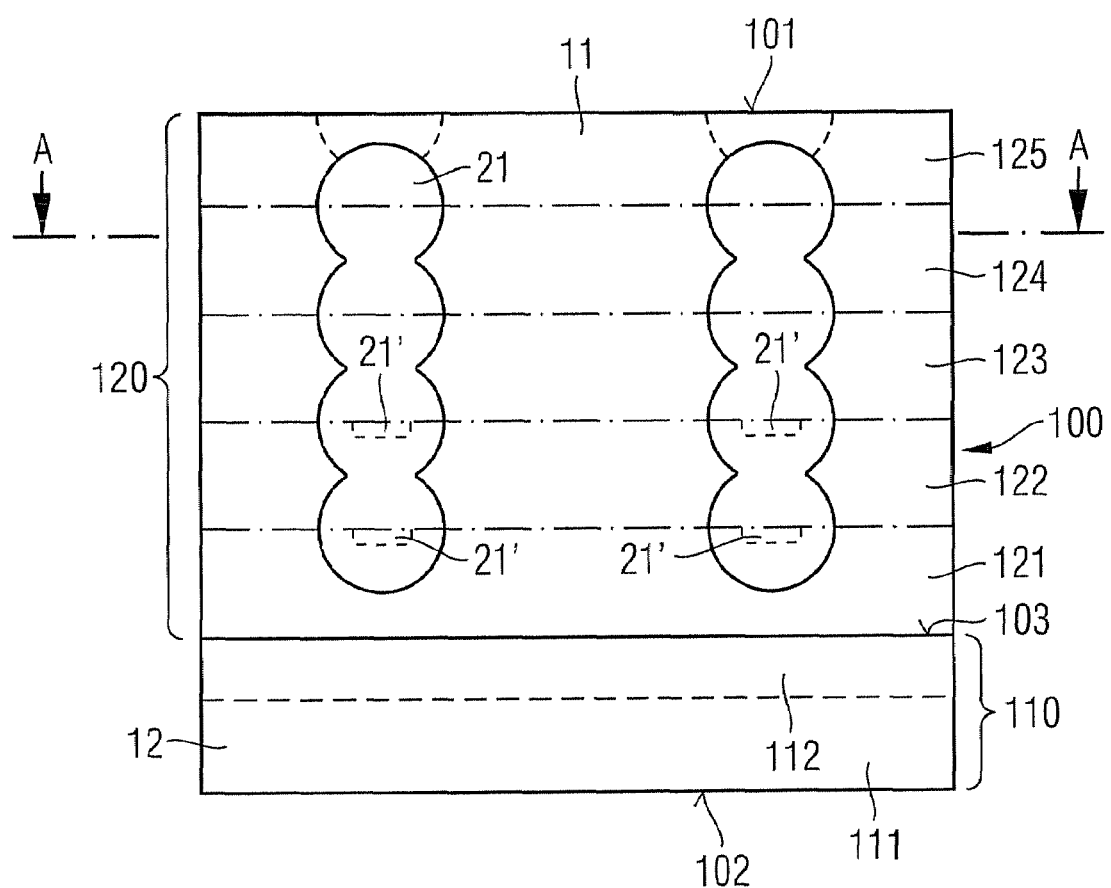

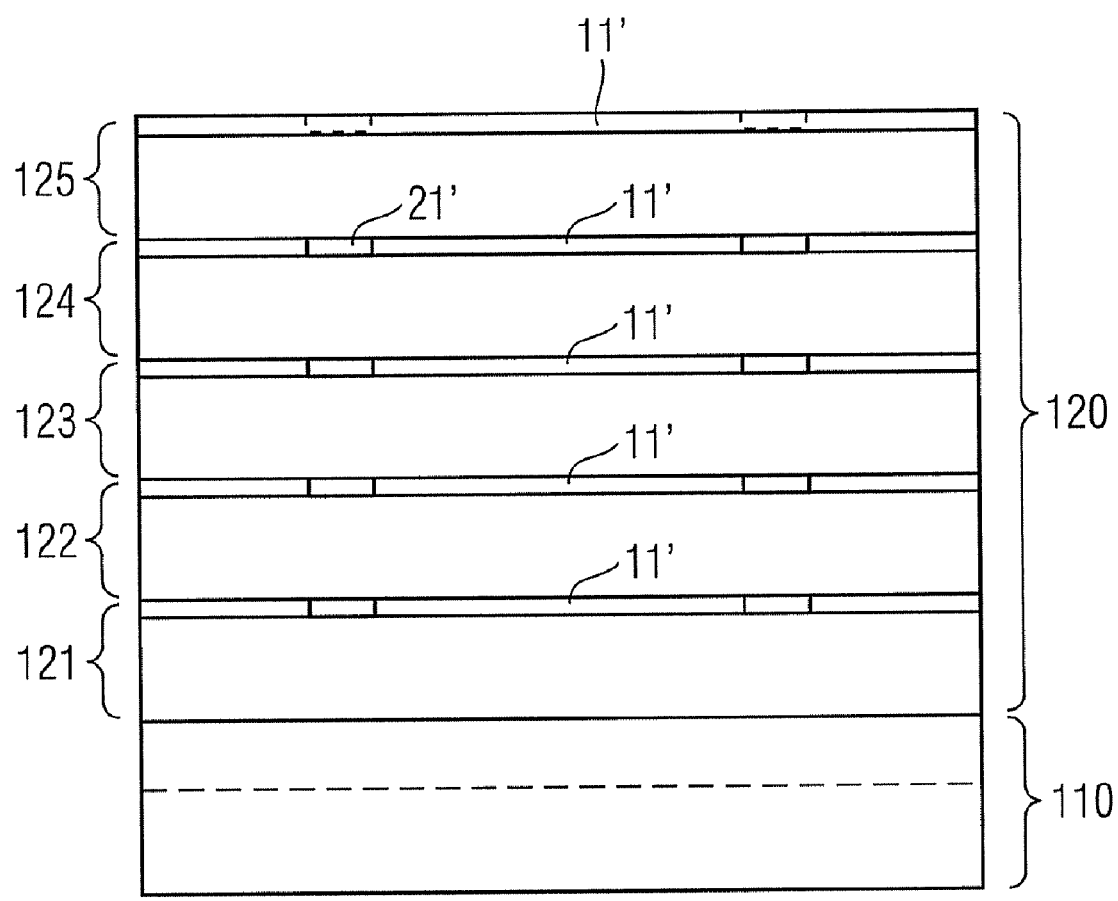

FIG 4  A-A
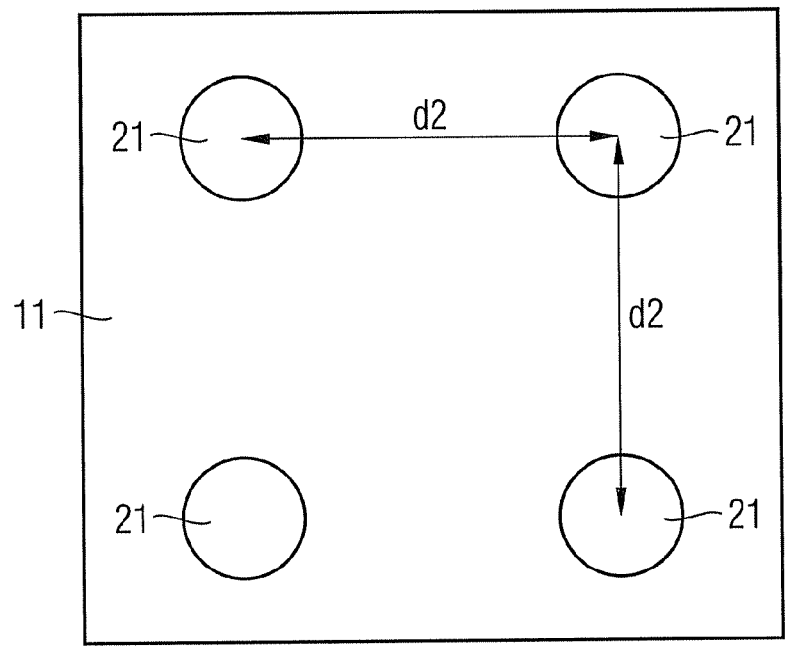
FIG 5  A-A
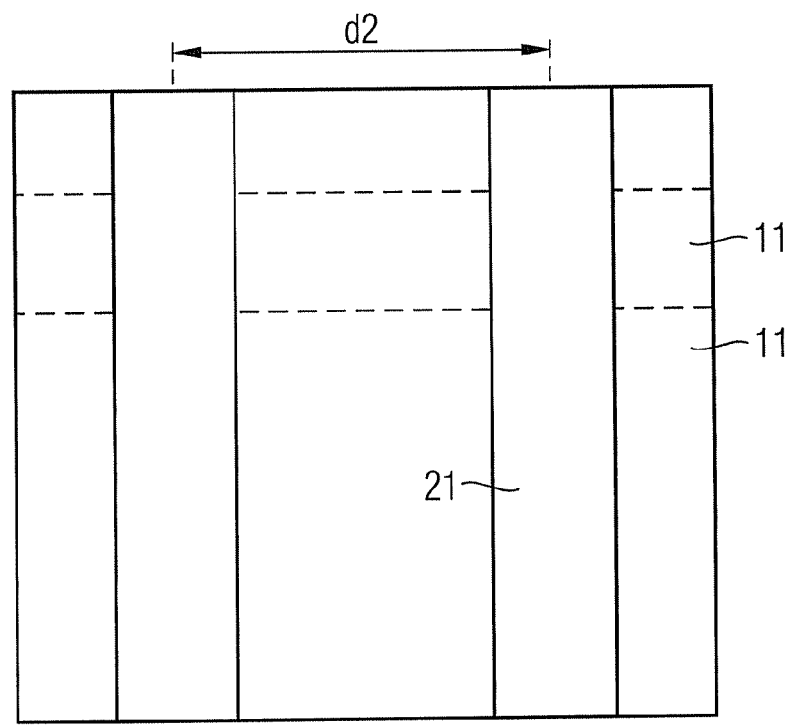

RADIATION DETECTOR AND METHOD

BACKGROUND

Radiation detectors serve for detecting ionizing radiation, such as e.g., beta radiation or gamma radiation.

Semiconductor-based radiation detectors include a semiconductor body with two semiconductor zones which are doped complementarily to one another and which form a pn junction. During operation of the radiation detector, the pn junction is reverse-biased by an electrical voltage being applied to the semiconductor zones by using connection electrodes. This results in an electric field within the semiconductor body. If ionizing radiation enters into the semiconductor body during the operation of the radiation detector, then charge carriers are generated which, owing to the electric field, generate a current pulse that can be measured between the connection electrodes.

SUMMARY

One embodiment provides a method for producing a radiation detector including a semiconductor body with a first base zone of a first conduction type and with at least one second base zone which is arranged in the first base zone, extends in a vertical direction of the semiconductor body and is doped complementarily to the first base zone. Semiconductor zones of a second conduction type are produced, which is complementary to the first conduction type, in epitaxial layers such that the complementarily doped semiconductor zones are adjacent to one another in a vertical direction and thus form the second base zone.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates an example of a method for producing a radiation detector including a first and a second base zone on the basis of cross-sectional illustrations of a semiconductor body during different method processes.

FIG. 3 illustrates one embodiment of a method for jointly producing a first and a second base zone.

FIG. 4 illustrates one embodiment of a geometry of the second base zone on the basis of a cross section through the semiconductor body in a cross-sectional plane illustrated in FIG. 1.

FIG. 5 illustrates one embodiment of a geometry of the second base zone on the basis of a cross section through the semiconductor body in a cross-sectional plane illustrated in FIG. 1.

DETAILED DESCRIPTION

Figure 2A:
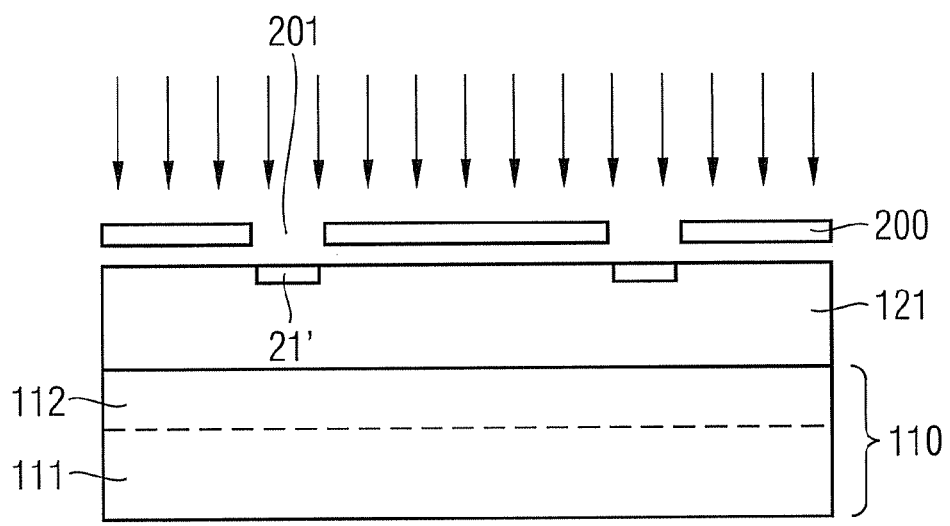
FIG. 2 illustrates one embodiment of a method for producing a second base zone in the first base zone.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment of a method for producing first and second base zones of a radiation detector which are doped complementarily to one another is explained below with reference to FIGS. 1A and 1B. Referring to FIG. 1A, this method first involves providing a semiconductor substrate 110. The semiconductor substrate has a first side 103 and a second side 102 remote from the first side 103. FIG. 1A illustrates an excerpt from the semiconductor substrate 110 in a vertical sectional plane. In this case, the vertical sectional plane is a sectional plane running perpendicular to the first and the second side 103 and 102. The semiconductor substrate 110 may be part of a semiconductor wafer that forms the basis for the production of a multiplicity of radiation detectors of identical type, which are singulated as required after the conclusion of the production process.

Silicon, for example, is suitable as semiconductor material for the production of the radiation detectors. In this case, the semiconductor substrate 110 is a monocrystalline semiconductor substrate composed of silicon.

Referring to FIG. 1B, during subsequent method processes, several epitaxial layers 121-125 are produced on the semiconductor substrate 110, the epitaxial layers being arranged one above another. The totality of these epitaxial layers 121-125 arranged one above another is referred to hereinafter as epitaxial layer stack 120. An epitaxial layer 121 produced first, which is applied directly to the first side 103 of the semiconductor substrate 110, is referred to hereinafter as bottommost epitaxial layer 121, and an epitaxial layer 125 produced last in the epitaxial layer stack 120 is referred to hereinafter as topmost epitaxial layer. The semiconductor substrate 110 and the epitaxial layer stack 120 arranged on the semiconductor substrate 110 together form a semiconductor body 100 with a first side 101, which is formed by the topmost epitaxial layer 125 and which is also referred to hereinafter as front side, and with a second side 102, which is formed by the second side of the semiconductor substrate 110 and which is also referred to hereinafter as rear side. FIG. 1B illustrates this semiconductor body 100 in a vertical sectional plane, that is to say in a sectional plane running perpendicular to the front and rear sides 101, 102.

Merely in order to afford a better understanding of the explanations below, FIG. 1B illustrates "boundaries" between the individual epitaxial layers 121-125 as dash-dotted lines. This makes it clear how far the individual epitaxial layers are grown during a respective deposition process. In actual fact, within the epitaxial layer stack 120, the boundaries between the individual epitaxial layers are not directly discernable since the epitaxial layers are monocrystalline layers, the bottommost layer 121 of which grows onto the semiconductor substrate 110 in mono crystalline fashion and the other epitaxial layers 122-125 of which grow onto the epitaxial layer respectively produced beforehand in monocrystalline fashion. Any epitaxy methods that are known in principle are suitable for producing the epitaxial layers, such that further explanations in this respect can be dispensed with.

The individual epitaxial layers 121-125 are produced in such a way that they include a basic doping of a first conduction type, for example, an n-type basic doping. A doping concentration of the basic doping lies, for example, in the range between a few $10^{12}$ cm$^{-3}$ up to a few $10^{13}$ cm$^{-3}$. That region of the epitaxial layer stack 120 which has the basic doping forms at least one part of the first base zone 11 of the later radiation detector.

Semiconductor zones of the second conduction type which are doped complementarily to the basic doping are additionally produced in the individual epitaxial layers 121-125 in such a way that the semiconductor zones of the second conduction type which are produced in the individual epitaxial layers are adjacent to one another in a vertical direction. A semiconductor region which is contiguous in a vertical direction, extends over the individual epitaxial layers 121-125 and is doped complementarily to the basic doping arises in this way. This semiconductor region doped complementarily to the basic doping of the epitaxial layers forms the second base zone 21 of the later radiation detector. The maximum doping concentrations of the semiconductor zones of the second conduction type are, for example, higher than the basic doping of the epitaxial layers. These doping concentrations are, for example, between one and two orders of magnitude (factor of 10 to 100) greater than the basic doping of the epitaxial layers 121-125. What can be achieved as a result of this is that the semiconductor zones of the second conduction type which are produced in the individual epitaxial layers rapidly "diffuse together" which will be explained below.

One embodiment of a method for producing the second base zone 21 is explained below with reference to FIGS. 2A and 2B. In this method, after producing the individual epitaxial layers 121-125, dopant atoms of a conduction type complementary to the basic doping of the epitaxial layers 121-125 are in each case implanted into the epitaxial layers 121-125. FIG. 2A illustrates such an implantation of dopant atoms on the basis of the bottommost epitaxial layer 121 produced first on the semiconductor substrate 110. The dopant atoms of the second conduction type are implanted using a mask 200, which has at least one cutout 201 which makes it possible to implant dopant atoms into the epitaxial layer 121 in the region of the cutout 201. The mask 200 may be held at a distance from the epitaxial layer 121, but may also be applied directly to the epitaxial layer 121. The mask 200 may include one cutout 201 or may include several cutouts arranged at a distance from one another in a horizontal direction. The dimensions and the mutual spacing of the cutouts 201 determine the geometry of the later second base zone 21 in a manner that will be explained in more detail below.

In the region of the at least one cutout 201 of the mask 200, an implantation region 21' arises in the epitaxial layer 121, dopant atoms of the second conduction type being arranged in concentrated fashion in the implantation region. The position of the implantation region 21' in a vertical direction within the epitaxial layer 121 is dependent on the implantation energy, that is to say the energy with which the dopant atoms are implanted into the epitaxial layer 121. As is illustrated in FIG. 2A, the dopant atoms may be implanted into a region of the epitaxial layer 121 that is near the surface. Furthermore, there is also the possibility of implanting the dopant atoms more deeply into the epitaxial layer 121.

Instead of introducing the dopant atoms of the second conduction type into the epitaxial layers by using an implantation method, there is in one embodiment the possibility of covering the epitaxial layers, in those regions in which semiconductor zones of the second conduction type are intended to be produced, with a material containing dopant atoms of the second conduction type, and of subsequently indiffusing the dopant atoms from the material into the epitaxial layer. After the diffusion and before the production of a next epitaxial layer, the material containing the dopant atoms is to be removed in this case. In one embodiment, the dopant atoms of the second conduction type may also be directly indiffused locally.

After the dopant atoms of the second conduction type have been introduced into an epitaxial layer—the bottommost epitaxial layer 121 in the example illustrated—in the manner explained with reference to FIG. 2A, the next epitaxial layer 122 is produced, in which an implantation region 21' is in turn produced. These method processes are repeated until a desired number of epitaxial layers has been achieved, or until a desired vertical dimension of the first base zone 11 has been achieved. FIG. 2B illustrates the semiconductor body 100 in cross section after the deposition of all the epitaxial layers 121-125 and production of implantation regions 21' in the individual epitaxial layers 121-125. The production of an implantation region 21' in the topmost epitaxial layer 125 deposited last is optional. The implantation region 21' of the topmost epitaxial layer 125 is therefore illustrated by dashed lines in FIG. 2B.

Figure 2B:
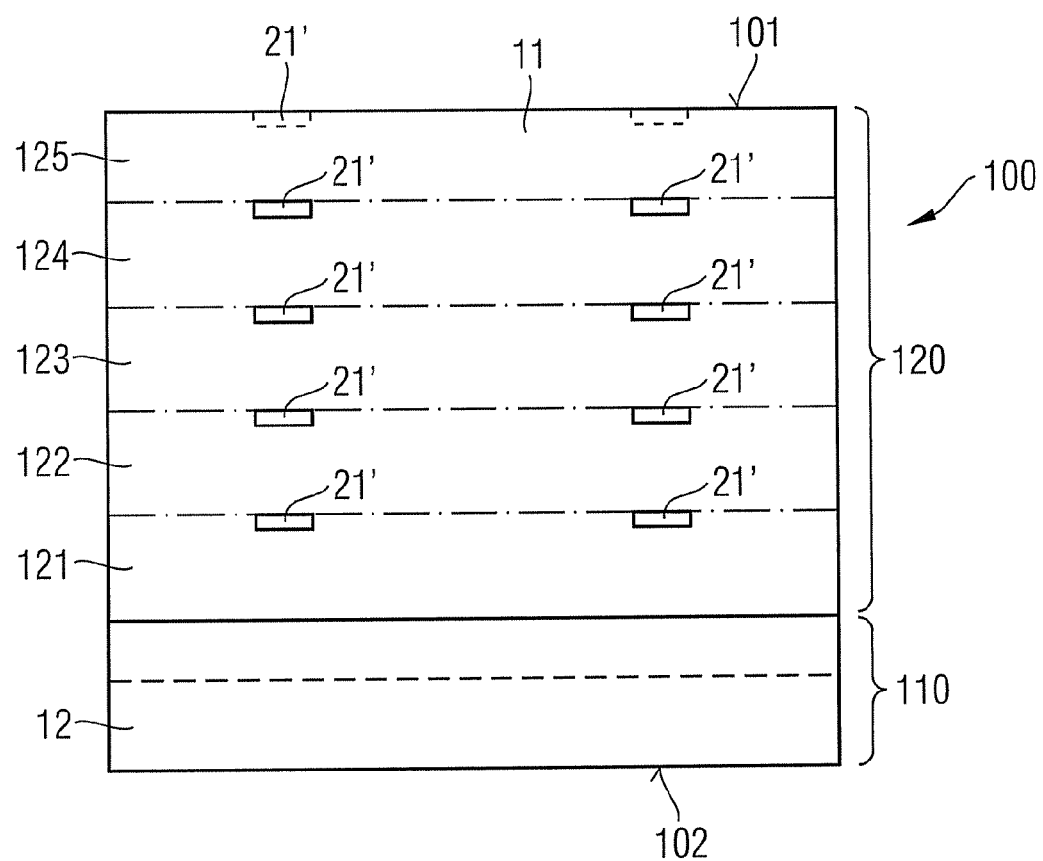

The dopant atoms are implanted into the individual epitaxial layers 121-125 in such a way that the implantation regions 21' are arranged one above another in a vertical direction of the semiconductor body 100, as is illustrated in FIG. 2B. If masks with several cutouts are used, then implantation regions 21' arranged in a manner lying one above another in a vertical direction are present at several locations in the epitaxial layer stack 120.

After the production of the epitaxial layers 121-125 and the targeted introduction of the dopant atoms of the second conduction type into the individual epitaxial layers 121-125, a thermal process is carried out in which the epitaxial layers 121-125 are heated. In this case, the duration and the temperature of the thermal process are chosen such that the implanted dopant atoms indiffuse further into the epitaxial layers 121-125 proceeding from the implantation regions 21', whereby semiconductor zones doped complementarily to the basic doping of the epitaxial layers 121-125 arise around the implantation regions 21', the semiconductor zones being referred to hereinafter as diffusion regions. In this case, the duration and the temperature of the thermal process are chosen such that the diffusion regions that form around two implantation regions 21' arranged adjacent in a vertical direction are adjacent to one another in a vertical direction of the semiconductor body 100, thus giving rise to the second base zone 21 that is continuous in a vertical direction and extends over the individual epitaxial layers 121-125.

In order to afford a better understanding of the operations during the diffusion process, the original implantation regions 21' are illustrated by dashed lines in the first and second epitaxial layers 121, 122 in FIG. 1B. If—as in the example illustrated—the implantation regions 21' are produced near the surface in the individual epitaxial layers, then the dopant atoms of the second conduction type diffuse from an implantation region 21' both into the epitaxial layer in which the implantation region 21' was produced and into the overlaying epitaxial layer. If the implantation regions 21'—in a manner not illustrated more specifically—are not produced near the surface but rather deep within the individual epitaxial layers, then the diffusion regions arise essentially within the individual epitaxial layers around the implantation regions 21' and are adjacent to one another in the region of the boundaries of the individual epitaxial layers.

In the method explained with reference to FIGS. 2A and 2B, the basic doping of the epitaxial layers 121-125 is already produced during the deposition process. The epitaxial layers are therefore doped in situ with dopant atoms of the first conduction type during the deposition process, which dopant atoms thus bring about the basic doping of the epitaxial layers 121-125 and hence the doping of the first base zone (11 in FIG. 1B). It should be noted in this connection that the implantation dose for producing the implantation regions 21' is chosen to be high enough that the basic doping of the epitaxial layers is compensated for in the region of the second base zone and a second base zone 21 including a net doping of the second conduction type arises. The implantation dose $D_P$ for the production of an implantation region in an epitaxial layer corresponds, for example, to the sum of the basic doping $N_D$ of the epitaxial layer which is to be compensated for and the desired doping of the second base zone $N_P$, multiplied by the thickness d of the respective epitaxial layer; that is to say that the following holds true:

$$D_P = (N_D + N_P) \cdot d \tag{1}$$

Instead of the basic doping of the epitaxial layers 121-125 already being produced during the deposition processes, there is the possibility of the individual epitaxial layers firstly being produced in undoped or intrinsic fashion and dopant atoms of the first conduction type being implanted into the individual epitaxial layers over the whole area after the production of each epitaxial layer. Referring to FIG. 3, which illustrates a cross section through the semiconductor body 100 after the production of all the epitaxial layers 121-125, implantation regions 11' of the first conduction type arise in the individual epitaxial layers 121-125 as a result. In addition to the implantation regions 11' of the first conduction type, the implantation regions 21' of the second conduction type are produced in a manner explained above. The thermal process already explained is subsequently carried out. During this thermal process, both the dopant atoms of the first conduction type from the first implantation regions 11' and the dopant atoms of the second conduction type from the implantation regions 21' of the second conduction type indiffuse into the epitaxial layers. In this case, dopant atoms which, at a given temperature, diffuse more rapidly than the dopant atoms of the implantation regions 21' of the second conduction type are chosen, for example, as dopant atoms for the implantation regions 11' of the first conduction type. This ensures that during the common thermal process for producing the basic doping of the epitaxial layers 121-125 and for producing the second base zone 21, the dopant atoms of the first conduction type diffuse in a vertical direction over the entire depth of the individual epitaxial layers and thus bring about a basic doping, while the dopant atoms of the second conduction type diffuse in a vertical direction only to an extent such that the individual diffusion regions are adjacent to one another. Suitable dopant atoms of the first conduction type are phosphorus atoms, for example, which bring about an n-type doping, or else more rapidly diffusing selenium or sulfur atoms. Doping with boron atoms is suitable, for example, for producing the p-doped zone. The temperature during the thermal process lies between 1000° C. and 1250° C., for example, and the duration of the thermal process lies between 1 hour and 10 hours, for example.

Referring to FIG. 4, in one example provision is made for producing the second base zone 21 in such a way that it has several pillar-type base zone sections which are arranged at a distance from one another in a lateral direction of the semiconductor body. FIG. 4 illustrates a cross section through the semiconductor body 100 in the region of the epitaxial layer stack 120 in a sectional plane A-A illustrated in FIG. 1B.

Referring to the explanations with regard to FIGS. 2 and 3, such a second base zone 21 including several base zone sections which are formed in pillar-type fashion and are arranged at a distance from one another in a lateral direction may be produced by virtue of the mask (200 in FIG. 2A) used for the implantation of the dopant atoms of the second conduction type including several cutouts (201 in FIG. 2A), arranged at a distance from one another in a lateral direction. In this case, the mutual center-to-center distance between the cutouts 201 determines the mutual center-to-center distance between the individual pillar-type base zone sections. In this case, "center-to-center distance" should be understood to mean the lateral distance from the center of one base zone section to the center of an adjacent base zone section. Referring to FIG. 4, the individual base zone sections may be arranged in a rectangular, in one embodiment square, grid. However, any other grids, in one embodiment hexagonal grids, may also be employed.

Referring to FIG. 5, which illustrates a lateral cross section through the epitaxial layer stack 120 in the sectional plane A-A for a further example, the second base zone 21 may also be realized in such a way that it has several strip-type or plate-type base zone sections arranged at a distance from one another in a lateral direction. Referring to the explanations with regard to FIGS. 2 and 3, such strip-type base zone sections are produced by virtue of the implantation mask 200 including strip-type cutouts 201 arranged at a distance from one another in a lateral direction.

Furthermore, the second base zone 21 may, for example, also be realized in such a way that it has a lattice-type structure, as is illustrated by dashed lines in FIG. 5. Such a lattice-type base zone 21 is produced, for example, by virtue of the implantation mask (200 in FIG. 2A) having a lattice-type cutout 201.

Figure 6:
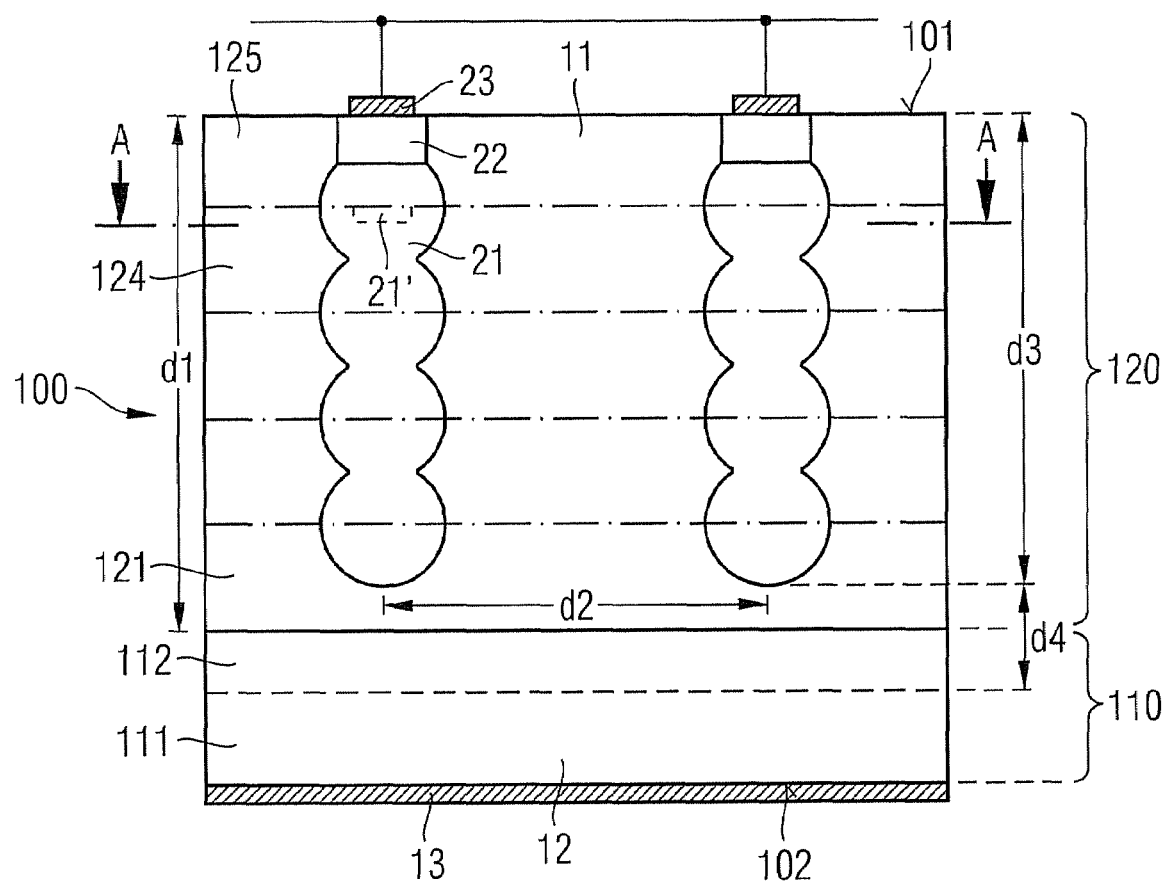
FIG. 6 illustrates one embodiment of a radiation detector.

FIG. 6 illustrates a vertical cross section through a radiation detector in accordance with one embodiment, the radiation detector including first and second base zones 11, 21 produced on the basis of the method explained above. Apart from the first base zone 11 of the first conduction type, which is formed at least partly by the basic doping of the epitaxial layers, and the second base zone 21 extending in a vertical direction of the semiconductor body 100, this radiation detector has a first connection electrode 13 for applying an electrical potential to the first base zone 11 and a second connection electrode 23 for applying an electrical potential to the second base zone 21. In the radiation detector illustrated, the first connection electrode 13 is applied to the rear side 102 of the semiconductor body 100 and connected to the first base zone 11 via the semiconductor substrate 110. In this radiation detector, the semiconductor substrate 110 is chosen such that it is of the same conduction type as the first base zone 11, that is to say of the first conduction type. In this case, the semiconductor substrate 110 is, in one embodiment, doped more highly than the first base zone 11 in order to ensure a low-impedance connection of the first connection electrode 13 to the first base zone 11 and forms a first connection zone 12.

The first connection electrode 13 is composed, for example, of a metal or a highly doped polycrystalline semiconductor material, such as polysilicon, and is applied to the rear side of the semiconductor body 100, for example, after the first and second base zone 11, 21 have been produced.

One example of the production method provides for at least partly removing the semiconductor substrate 110 proceeding from the rear side 102 before the production of the first connection electrode 13, for example, by using an etching, grinding or polishing method, in order thereby to reduce the vertical dimensions of a connection zone 12 formed by the semiconductor substrate 110 and thereby to reduce the electrical resistance between the connection electrode 13 and the first base zone 11. In a manner not illustrated more specifically, the semiconductor substrate 110 may in this case be removed completely, that is to say as far as the bottommost epitaxial layer 121. In this case, the first connection electrode 13 is applied directly to the first epitaxial layer 121, in which case, before the first connection electrode is applied, dopant atoms of the first conduction type may be implanted into a region of the epitaxial layer which is near the surface, in order to achieve a low-impedance connection of the connection electrode to the base zone 11.

The second connection electrode 23 is arranged in the region of the front side 101 of the semiconductor body 100 and is connected to the second base zone 21 via a second connection zone of the second conduction type. In this case, the second connection zone 22 may be doped more highly than the second base zone 21 and serves for the low-impedance connection of the second connection electrode 23 to the second base zone 21. The second connection zone 22, with regard to its extent in a lateral direction, may be restricted to those regions in which the second base zone is arranged. In a manner not illustrated more specifically, however, the second connection zone 22 may also extend over regions of the first base zone 11 and in this case, in addition to the pn junction between the first and second base zones 11, 21, form a pn junction between the first base zone 11 and the second connection zone 22.

The second connection zone 22 is produced, for example, by implanting dopant atoms via the front side 101 and carrying out a subsequent thermal activation process. In this case, the second connection zone 22 may extend into the semiconductor body 100 proceeding from the front side 101 in a vertical direction to an extent such that it is adjacent to the diffusion region that proceeds from the implantation region 21' of the penultimate epitaxial layer 124 produced. The implantation region 21' is illustrated by dashed lines in FIG. 6. In this case, it is possible to dispense with producing an implantation region 21' in the topmost epitaxial layer 125 produced last.

Figure 7:
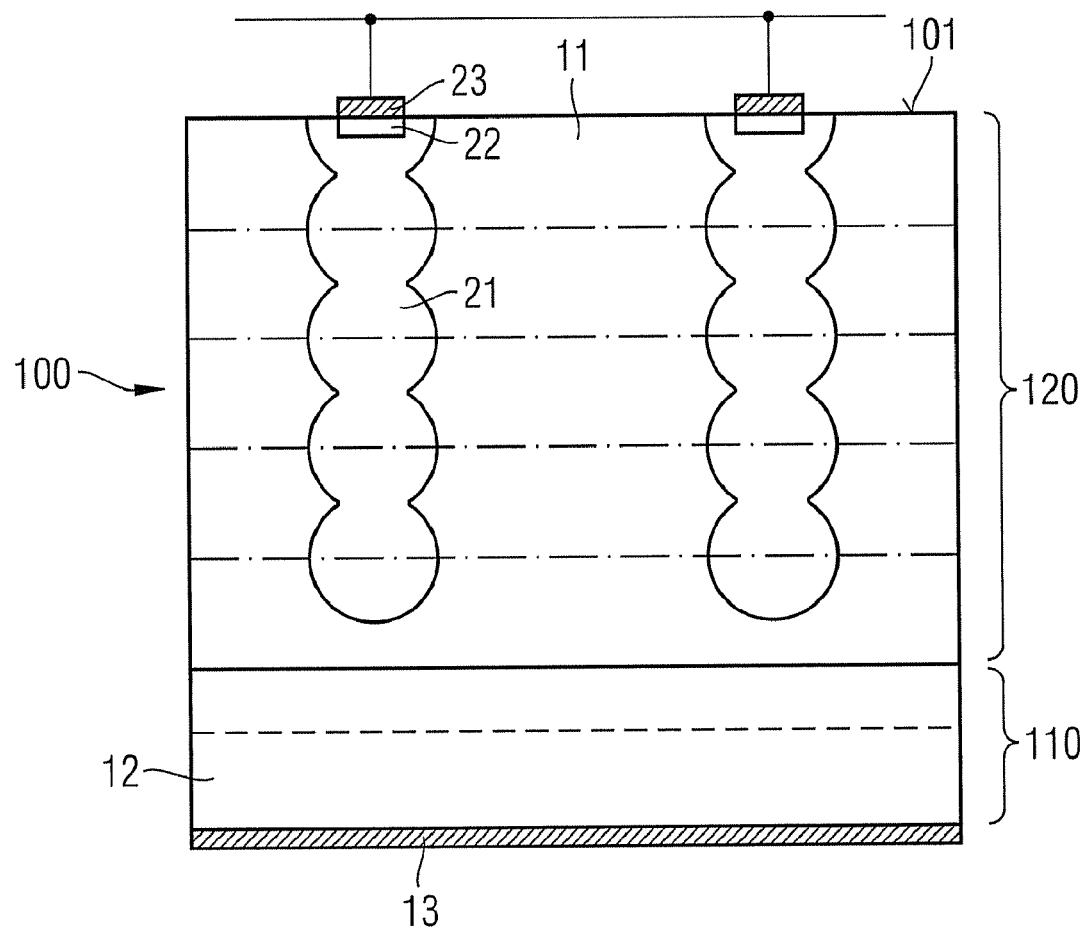
FIG. 7 illustrates one embodiment of a radiation detector.

By contrast, if such an implantation region 21' is also produced in the topmost epitaxial layer 125, then the second base zone 21 reaches as far as the front side 101 of the semiconductor body, which is illustrated for the radiation detector in FIG. 7. In this case, what suffices as second connection zone 22 is a semiconductor zone which has only small dimensions in a vertical direction and which serves only for reducing a contact resistance between the second connection electrode 23 and the second base zone 21.

During the operation of the radiation detector, an electrical voltage is applied between the first and second base zones 11, 21 via the connection electrodes 13, 23, the voltage being chosen such that a pn junction present between the first and second base zones 11, 21 is reverse-biased. Proceeding from the pn junction, a space charge zone propagates owing to the voltage. In this case, the voltage may be chosen in one embodiment such that the space charge zone covers the entire region of the first base zone 11 between adjacent base zone sections of the second base zone 21. The entire region of the first base zone 11 between adjacent base zone sections of the second base zone 21 then no longer has any free charge carriers, that is to say is fully depleted. If ionizing radiation then enters into the first base zone 11, charge carrier pairs are generated in the first base zone 11, the charge carriers of which, owing to the prevailing electric field, are transported to the first and second connection electrodes 13, 23 and generate a current pulse that may be measured and flows between the connection electrodes 13, 23.

In the radiation detector illustrated, in which the second base zone 21 extends into the first base zone 11 in a vertical direction, the entire volume of the first base zone 11 is available as detection volume during operation of the radiation detector. In this context, "detection volume" should be understood to mean a volume of the semiconductor body which is available for the detection of radiation, that is to say in which free charge carriers are generated and are transported to the connection electrodes under the influence of an electric field if ionizing radiation occurs.

The method explained makes it possible, in a simple manner, to produce a radiation detector having a very large detection volume and, in one embodiment, including first and second base zones 11, 21 extending deep into the semiconductor body 100 in a vertical direction. In this case, the dimensions of the first and second base zones 11, 12 in a vertical direction of the semiconductor body 100 are substantially determined by the dimensions of the individual epitaxial layers 121-125 and the number of epitaxial layers 121-125 produced one above another. The thickness and the number of the individual epitaxial layers 121-125 are chosen, for example, such that a dimension d1 of the first base zone 11 in a vertical direction lies between 100 and 300 µm. The second base zone 21 may be produced such that it extends in a vertical direction at least approximately over the entire depth of the first base zone 11. However, it may also be produced such that it is only arranged in an upper region, i.e. region facing the front side 101, of the first base zone 11. A distance between a lower end—proceeding from the front side 101—of the second base zone 21 and the front side 101 is between 30 µm and 300 µm, for example. The ratio d1/d3 of the dimensions d1 and d3 of the first and second base zones 11, 21 is between 1 and 10, for example. A second base zone 21 that is only arranged in the upper region of the first base zone 11 may be produced in various ways: in a first method it is provided that, on the semiconductor substrate 110 that forms the later first connection zone 12, firstly an epitaxial layer that is thick in comparison with the rest of the epitaxial layers is produced or that several epitaxial layers without implantation regions are produced, which only form the first base zone 11, before an epitaxial layer with implantation regions is produced, which then serves both for producing a part of the first base zone 11 and a part of the second base zone 21.

A second method provides for using a lightly doped semiconductor substrate, the basic doping of which is chosen such that it corresponds to the desired doping of the first base zone 11. The doping concentration of the basic doping lies between $10^{12}$ cm$^{-3}$ and a few $10^{13}$ cm$^{-3}$, for example. The semiconductor substrate forms a part of the first base zone 11. Afterward, one or several epitaxial layers are produced on the substrate, semiconductor zones of the second conduction type are produced in the layers and the layers therefore form a further part of the first base zone 11 and the second base zone 21. In order to produce the first connection zone 11, a doping concentration of the substrate in the region of the second side 102 is subsequently increased by dopant atoms of the first conduction type or atoms effective as donors or acceptors—depending on the doping type—being introduced into the semiconductor substrate via the second side 102, e.g., by implantation.

A voltage to be applied at which the first base zone 11 is fully depleted is dependent on the doping concentration of the first base zone 11 and the second base zone 21 and is additionally dependent on a center-to-center distance between adjacent base zone sections of the first base zone 21. In this context, "base zone sections" should be understood to mean the above-explained pillar-type base zone sections or the plate-type base zone sections. In the case of a lattice-type second base zone 21, base zone sections are those sections of the lattice which are arranged at a distance from one another in a lateral direction. This mutual center-to-center distance d2, which is also referred to as "pitch", is between 20 µm and 160 µm, for example.

For a given volume of the semiconductor body 100, the detection volume may be maximized by choosing the volume of the second base zone 21 to be as small as possible. This may be achieved by choosing the dopant concentration of the second base zone 21 to be higher than the dopant concentration of the first base zone 11. Despite the smaller volume of the second base zone 21 in comparison with the first base zone 11, in this case the first base zone 11 may nevertheless be at least approximately fully depleted, to be precise even at a low voltage applied to the detector. A ratio D21/D11 between a maximum doping concentration D21 of the second base zone 21 and a maximum doping concentration D11 of the first base zone 11 lies between 2 and $10^5$, for example. In absolute terms the doping concentration of the first base zone 11 lies below $10^{13}$ cm$^{-3}$, for example, while the maximum doping concentration of the second base zone lies between $10^{14}$ cm$^{-3}$ and $10^{19}$ cm$^{-3}$, for example. The doping concentrations in the first and second connection zones 12, 22 lie above $10^{16}$ cm$^{-3}$ and respectively $3 \cdot 10^{19}$ cm$^{-3}$, for example.

The dopings of the first and second base zones 11, 21 may be chosen, in one embodiment, such that the dopant charge of the second conduction type that is present in the second base zone 21 is greater than the dopant charge of the first conduction type that is present in the first base zone 11. If a plane of the epitaxial layer stack 120 in which sections of both the first and the second base zone 11, 21 are present is considered, then this means that the number of dopant atoms of the second conduction type exceeds the number of dopant atoms of the first conduction type in this plane. For the operation of the radiation detector this means that the second base zone 21 is not fully depleted upon application of a voltage which is typical of detector operation and by which the first base zone 11 is fully depleted. A voltage which is typical of detector operation may be between 5% and 95% of the breakdown voltage, for example. The detector voltage and the dimensions of the second base zone 21 in a lateral direction may be coordinated with one another in one embodiment in such a way that a lateral extent of a region that is not depleted upon application of the detector voltage in the second base zone 21 is less than a charge carrier diffusion length prevailing in the second base zone 21. The width of this non-depleted region is, for example, less than 50% of the diffusion length or less than 10% of the diffusion length. This minimizes a recombination of free charge carriers generated by radiation in the second base zone 21, whereby the detection sensitivity of the radiation detector is maximized.

The second base zone 21 may be doped in one embodiment so highly that a lateral dose of dopant atoms of the second conduction type is between 0.1 times and 1000 times, in one embodiment between 2 times and 10 times, the breakdown charge of the semiconductor material used for the radiation detector. The breakdown charge is a value specific to the respective semiconductor material, which value is approximately $2 \cdot 10^{12}$ cm$^{-2}$, for example, for silicon. In this context, the "lateral dose" should be understood to mean the integral of dopant concentration, which is determined in a lateral direction perpendicular to the pn junction between the first and second base zones 21 proceeding from the center of a base zone section of the second base zone 21 as far as the pn junction.

Referring to FIG. 1, the semiconductor substrate 110 may include two differently doped semiconductor layers, namely a more highly doped first semiconductor layer 111, which forms the second side 102, and a more lightly doped second semiconductor layer 112, which forms the first side 103. In this case, the more highly doped first semiconductor layer 111 forms the first connection zone 12, while the more lightly doped semiconductor layer 112 forms a part of the first base zone 11 of the radiation detector. In this case, the doping concentration of the second semiconductor layer 111 may correspond to the basic doping of the epitaxial layers. However, the second semiconductor layer 112 may also be doped more highly or more lightly than the basic doping of the epitaxial layers. It should also be noted that the first and second semiconductor layers 111, 112 are of the same conduction type.

A vertical distance d4 between the second base zone 21 and the first connection zone 12 is, for example, in the region of the mutual lateral distance d2 between the base zone sections. However, the distance d4 may also be a multiple of the distance d2, such as e.g., 2- to 5-fold. The distance d4 may be set by way of the thickness of the epitaxial layer 121 deposited first, if the semiconductor substrate 110 is doped homogeneously. If the semiconductor substrate 110 has a more highly doped semiconductor layer 111, which forms the first connection zone 12, and a more lightly doped semiconductor layer 112, then the distance d4 may be set both by way of the thickness of the more lightly doped layer 112 and by way of the thickness of the epitaxial layer 121 deposited first.

When carrying out the method explained above, in which the semiconductor substrate 110 is ground back before the first connection electrode 13 is produced, there is the possibility, when using a semiconductor substrate 110 including two semiconductor layers, of completely removing the more highly doped semiconductor layer 111 and of applying the first connection electrode 13 directly to the more lightly doped semiconductor layer 112, in which case, in order to reduce a contact resistance, if appropriate, beforehand dopant atoms of the first conduction type are also implanted into a region of the more lightly doped semiconductor layer 112 that is near the surface.

Figure 8:
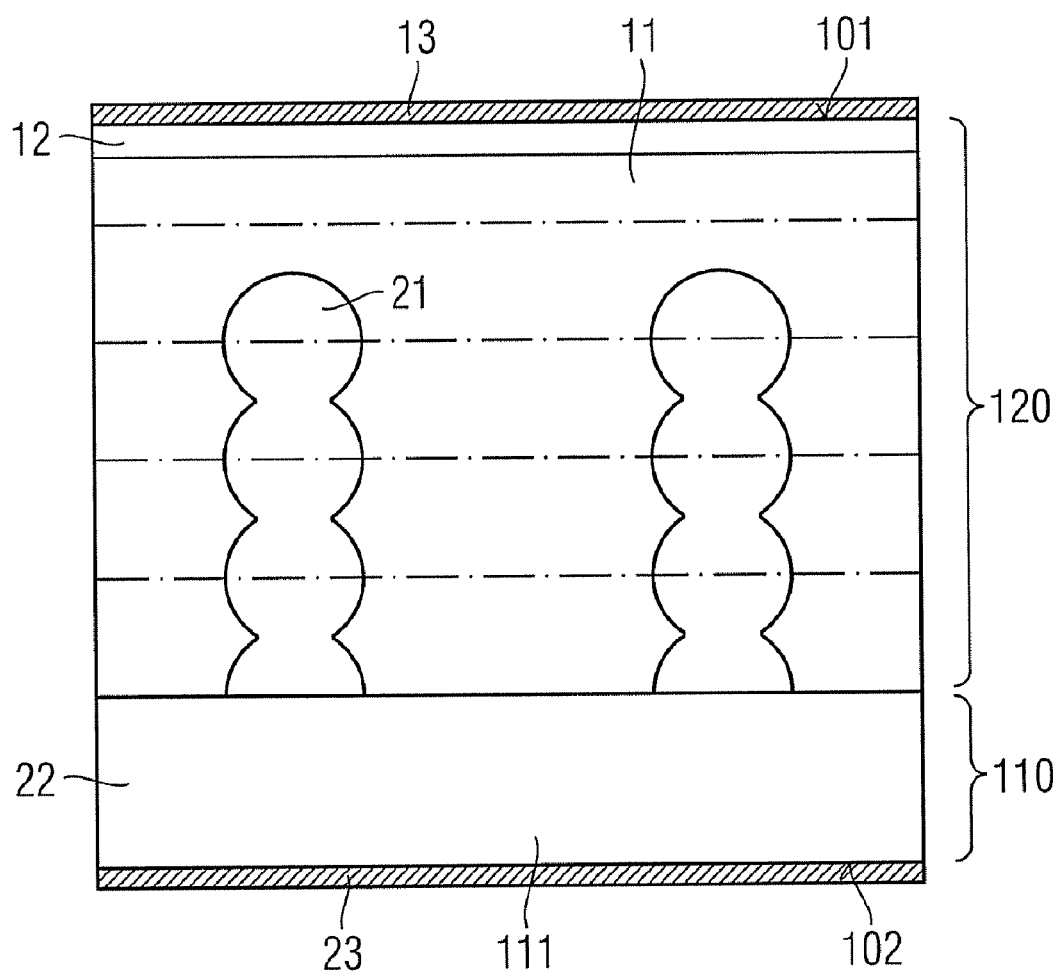
FIG. 8 illustrates one embodiment of a radiation detector.

FIG. 8 illustrates a cross section through a radiation detector in accordance with a further example. This radiation detector differs from the radiation detectors explained above in that the second base zone 21 is produced such that it is adjacent to the semiconductor substrate 110. In this radiation detector, the semiconductor substrate 110 has a doping concentration of the second conduction type and forms the second connection zone 22 in this radiation detector. In this component, the connection electrode applied to the rear side 102 of the semiconductor body forms the second connection electrode 23. In this component, contact is made with the first base zone 11 by a first connection electrode 12 applied to the front side 101. In order to reduce a contact resistance between the first connection electrode 12 and the second base zone 11, a more highly doped first connection zone 12 is provided, which is produced, for example, by implantation of dopant atoms. In the radiation detector illustrated in FIG. 8, the second base zone 21 is produced using the method explained with reference to FIGS. 2 and 3. The fact of the second base zone 21 being adjacent to the second connection zone 22 formed by the semiconductor substrate 110 is facilitated in this method by virtue of the fact that, during the thermal process, dopant atoms from the highly doped semiconductor substrate 110 indiffuse into the epitaxial layer 121 deposited first.

In principle, the method explained above is also suitable for producing a solar cell. A radiation detector and a solar cell have the same construction. In contrast to a radiation detector, however, a voltage is not applied to the solar cell, rather a current induced by radiation is tapped off at the connection terminals. Consequently, the radiation detector explained hitherto may also be used as a solar cell.

Finally it should be noted that device or method features that have been explained in connection with one example may be combined with device or method features of other examples when in those cases in which such combinations have not explicitly been explained. In one embodiment, features that are mentioned in one of the following claims may be combined with features of any other claim.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a radiation detector comprising a semiconductor body with a first base zone of a first conduction type and with at least one second base zone arranged at least partly in the first base zone, extends in a vertical direction of the semiconductor body and is doped complementarily to the first base zone, wherein the method comprises: providing a semiconductor substrate; producing several contiguous epitaxial layers arranged one above another on the semiconductor substrate, each layer comprising a basic doping of the first conduction type and together with the semiconductor substrate form the semiconductor body; and producing semiconductor zones of a second conduction type, complementary to the first conduction type, in the epitaxial layers in such a way that the complementarily doped semiconductor zones are adjacent to one another in a vertical direction and thus form the at least one second base zone.

2. The method of claim 1, comprising wherein the semiconductor substrate is of the same conduction type as the basic doping of the epitaxial layers.

3. The method of claim 2, wherein the semiconductor substrate comprises a first semiconductor layer and a second semiconductor layer, doped more lightly than the first semiconductor layer, and wherein the epitaxial layers are applied to the second semiconductor layer.

4. The method of claim 3, comprising wherein the second semiconductor layer is an epitaxial layer applied to the first semiconductor layer.

5. The method of claim 1, comprising doping the semiconductor substrate complementarily to a basic doping of the epitaxial layers.

6. The method of claim 1, wherein producing the complementarily doped semiconductor zones comprises:

implanting dopant atoms of the second conduction type into at least some of the several epitaxial layers after these several epitaxial layers have been produced; and
carrying out at least one thermal process, the temperature and duration of which are chosen such that the implanted dopant atoms indiffuse.

7. The method of claim 6, comprising choosing the temperature and duration of the thermal process such that the dopant atoms indiffuse as far as a depth corresponding to at least 50% of the thickness of the individual epitaxial layers.

8. The method of claim 6, comprising carrying out a respective thermal process after producing one or more of the epitaxial layers.

9. The method of claim 1, comprising producing the basic doping of the individual epitaxial layers during a deposition process.

10. The method of claim 1, wherein producing the basic doping of the epitaxial layers comprises:

implanting dopants of the first conduction type into the epitaxial layers in each case after producing the latter; and
carrying out at least one thermal process, the temperature and duration of which are chosen such that the implanted dopant atoms indiffuse.

11. The method of claim 10, comprising choosing the temperature and duration of the thermal process such that the dopant atoms indiffuse as far as a depth corresponding to at least 50% of the thickness of the individual epitaxial layers.

12. The method of claim 1, comprising:

producing a first connection electrode, which makes contact with the first base zone; and
producing a second connection electrode, which makes contact with the second base zone.

13. The method of claim 12, comprising:

producing a connection zone of the second conduction type adjacent to the second base zone and doped more highly than the second base zone is produced before the second connection electrode, and
producing the second connection electrode in such a way that it makes contact with the connection zone.

14. The method of claim 1, comprising producing several semiconductor zones of the second conduction type arranged adjacent to one another in a lateral direction of the epitaxial layers in the epitaxial layers in such a way as to give rise to a second base zone comprising several base zone sections which each extend in a vertical direction of the semiconductor body.

15. The method of claim 14, comprising producing the base zone sections such that their center-to-center distance is between 20 μm and 160 μm.

16. The method of claim 14, comprising producing the base zone sections such that a ratio between the maximum net doping concentration of the base zone sections and the net doping concentration of the epitaxial layers is between 2 and 105.

17. The method of claim 14, comprising producing the base zone sections such that a net dopant dose in a lateral direction running perpendicular to the vertical direction is between 0.1 times and 1000 times the breakdown charge of the semiconductor material used for the epitaxial layers.

18. A method for producing a solar cell comprising: providing a semiconductor substrate; producing several contiguous epitaxial layers arranged one above another on the semiconductor substrate, each layer comprising a basic doping of the first conduction type and together with the semiconductor substrate form a semiconductor body including a first base zone of a first conduction type and with at least one second base zone arranged at least partly in the first base zone doped complementarily to the first base zone; and producing semiconductor zones of a second conduction type, complementary to the first conduction type, in the epitaxial layers such that the complementarily doped semiconductor zones are adjacent to one another in a vertical direction and form the at least one second base zone.

19. A radiation detector, comprising: a semiconductor body with a first side and with a second side; a first base zone of a first conduction type, arranged in the semiconductor body; at least one second base zone of a second conduction type complementary to the first conduction type, arranged at least partly in the first base zone and extends in a vertical direction of the semiconductor body;

a first connection electrode, connected to the first base zone, and a second connection electrode, which is connected to the second base zone; and wherein the semiconductor body comprises a semiconductor substrate and several contiguous epitaxial layers applied on the semiconductor substrate, each layer having a basic doping of the first conduction type, wherein the first and the second base zone are arranged at least partly in the epitaxial layers, and wherein the first connection electrode makes contact with the semiconductor substrate at a side remote from the epitaxial layers.

20. The radiation detector of claim 19, wherein the second base zone comprises several base zone sections arranged at a distance from one another in a lateral direction of the semiconductor body.

21. The radiation detector of claim 20, comprising wherein a ratio between the maximum net doping concentration of the base zone sections and the net doping concentration of the epitaxial layers is between 2 and 105.

22. The radiation detector of claim 20, comprising wherein a net dopant dose in a lateral direction running perpendicular to the vertical direction is between 0.1 times and 1000 times the breakdown charge of the semiconductor material used for the epitaxial layers.

23. The radiation detector of claim 19, comprising wherein the semiconductor substrate is of the first conduction type, and wherein the semiconductor substrate comprises a more highly doped semiconductor layer and, between the more highly doped semiconductor layer and the first and the second base zone, a more lightly doped semiconductor layer of the first conduction type.

24. A radiation detector, comprising: a semiconductor body with a first side and with a second side;

a first base zone of a first conduction type, arranged in the semiconductor body; at least one second base zone of a second conduction type complementary to the first conduction type, arranged at least partly in the first base zone and extends in a vertical direction of the semiconductor body;

the semiconductor body including a semiconductor substrate and several contiguous epitaxial layers applied on the semiconductor substrate, each layer having a basic doping of the first conduction type, wherein the first and the second base zone are arranged at least partly in the epitaxial layers, and wherein a first connection electrode makes contact with the semiconductor substrate at a side remote from the epitaxial layers.

25. The radiation detector of claim 24, extends in vertical direction of the semiconductor between 30 μm and 300 μm.

* * * * *